United States Patent
Luo et al.

(10) Patent No.: US 7,759,206 B2
(45) Date of Patent: Jul. 20, 2010

(54) METHODS OF FORMING SEMICONDUCTOR DEVICES USING EMBEDDED L-SHAPE SPACERS

(75) Inventors: Zhijiong Luo, Carmel, NY (US); Young Way Teh, Singapore (SG); Atul C. Ajmera, Wappingers Falls, NY (US)

(73) Assignees: International Business Machines Corporation, Armonk, NY (US); Chartered Semiconductor Manufacturing Ltd., Singapore (SG)

( * ) Notice: Subject to any disclaimer, the term of this patent is extended or adjusted under 35 U.S.C. 154(b) by 11 days.

(21) Appl. No.: 11/164,567

(22) Filed: Nov. 29, 2005

(65) Prior Publication Data
US 2007/0122988 A1    May 31, 2007

(51) Int. Cl.
*H01L 21/336* (2006.01)
(52) U.S. Cl. ............... 438/303; 438/595; 257/E21.626; 257/E21.619; 257/E21.438
(58) Field of Classification Search ............... 438/142, 438/303, 305, 595; 257/E21.409, E21.438, 257/E21.626, E21.619
See application file for complete search history.

(56) References Cited

U.S. PATENT DOCUMENTS

| | | | | |
|---|---|---|---|---|
| 5,153,145 A * | 10/1992 | Lee et al. | | 438/305 |
| 5,234,850 A * | 8/1993 | Liao | | 438/231 |
| 5,290,720 A * | 3/1994 | Chen | | 438/304 |
| 5,547,885 A * | 8/1996 | Ogoh | | 438/286 |
| 5,679,589 A | 10/1997 | Lee et al. | | 437/40 |
| 5,739,573 A | 4/1998 | Kawaguchi | | 257/384 |
| 5,770,508 A * | 6/1998 | Yeh et al. | | 438/305 |
| 5,817,562 A | 10/1998 | Chang et al. | | 438/305 |
| 6,087,234 A | 7/2000 | Wu | | 438/299 |
| 6,144,071 A | 11/2000 | Gardner et al. | | 257/344 |
| 6,156,598 A | 12/2000 | Zhou et al. | | 438/231 |
| 6,251,764 B1 | 6/2001 | Pradeep et al. | | 438/595 |
| 6,277,683 B1 | 8/2001 | Pradeep et al. | | 438/200 |
| 6,380,039 B2 | 4/2002 | Badenes et al. | | 438/301 |
| 6,391,732 B1 | 5/2002 | Gupta et al. | | 438/305 |
| 6,432,784 B1 | 8/2002 | Yu | | 438/303 |
| 6,455,384 B2 | 9/2002 | Ang et al. | | 438/300 |
| 6,465,312 B1 | 10/2002 | Yu | | 438/300 |
| 6,506,650 B1 | 1/2003 | Yu | | 438/301 |
| 6,512,266 B1 | 1/2003 | Deshpande et al. | | 257/333 |
| 6,555,865 B2 * | 4/2003 | Lee et al. | | 257/314 |
| 6,593,198 B2 * | 7/2003 | Segawa | | 438/303 |
| 6,614,079 B2 | 9/2003 | Lee et al. | | 257/382 |
| 6,632,745 B1 | 10/2003 | Yap et al. | | 438/696 |

(Continued)

FOREIGN PATENT DOCUMENTS

JP    2004274022    9/2004

(Continued)

*Primary Examiner*—Mary Wilczewski
(74) *Attorney, Agent, or Firm*—Ohlandt, Greeley, Ruggiero & Perle, L.L.P.; Joseph Petrokaitis, Esq.; IBM Corporation

(57) ABSTRACT

A method of forming a semiconductor device that embeds an L-shaped spacer is provided. The method includes defining an L-shaped spacer on each side of a gate region of a substrate and embedding the L-shaped spacers in an oxide layer so that the oxide layer extends over a portion of the substrate a predetermined distance from a lateral edge of the L-shaped spacer. And removing oxide layers to expose the L-shape spacers.

9 Claims, 8 Drawing Sheets

U.S. PATENT DOCUMENTS

| | | | |
|---|---|---|---|
| 6,696,334 B1 | 2/2004 | Hellig et al. | 438/230 |
| 6,713,357 B1 | 3/2004 | Wang et al. | 438/287 |
| 6,716,689 B2 | 4/2004 | Bae et al. | 438/182 |
| 6,727,135 B2 | 4/2004 | Lee et al. | 438/230 |
| 6,762,085 B2 * | 7/2004 | Zheng et al. | 438/199 |
| 6,806,584 B2 | 10/2004 | Fung et al. | 257/900 |
| 6,815,320 B2 | 11/2004 | Kim et al. | 438/585 |
| 6,815,355 B2 | 11/2004 | Quek | 438/694 |
| 6,881,616 B1 | 4/2005 | Hellig et al. | 438/181 |
| 6,881,633 B2 | 4/2005 | Hokazono | 438/285 |
| 6,885,084 B2 | 4/2005 | Murthy et al. | 257/622 |
| 6,930,007 B2 * | 8/2005 | Bu et al. | 438/289 |
| 7,018,888 B2 * | 3/2006 | Goodlin et al. | 438/230 |
| 7,399,690 B2 * | 7/2008 | Kwon | 438/595 |
| 2002/0127763 A1 | 9/2002 | Arafa et al. | 438/76 |
| 2002/0177284 A1 * | 11/2002 | Huang | 438/303 |
| 2003/0020111 A1 | 1/2003 | Bevan | 257/303 |
| 2003/0183881 A1 * | 10/2003 | Lee et al. | 257/382 |
| 2003/0209765 A1 | 11/2003 | Lee et al. | 438/286 |
| 2004/0072435 A1 | 4/2004 | Quek | 438/691 |
| 2004/0157397 A1 | 8/2004 | Quek | 438/305 |
| 2004/0164320 A1 | 8/2004 | Quek et al. | 257/197 |
| 2004/0262784 A1 | 12/2004 | Doris et al. | 257/900 |
| 2004/0266121 A1 * | 12/2004 | Wu et al. | 438/303 |
| 2005/0037585 A1 | 2/2005 | Park et al. | 438/305 |
| 2005/0040479 A1 * | 2/2005 | Koldiaev et al. | 257/411 |
| 2005/0048753 A1 | 3/2005 | Schwan | 438/595 |
| 2005/0055494 A1 | 3/2005 | Doris et al. | 711/103 |
| 2005/0059228 A1 | 3/2005 | Bu et al. | 438/595 |
| 2005/0118770 A1 * | 6/2005 | Nandakumar et al. | 438/305 |
| 2005/0224867 A1 * | 10/2005 | Huang et al. | 257/327 |
| 2006/0024872 A1 | 2/2006 | Goodlin et al. | 438/196 |
| 2006/0099744 A1 * | 5/2006 | Chidambaram et al. | 438/142 |
| 2006/0121681 A1 * | 6/2006 | Nandakumar | 438/302 |
| 2007/0023822 A1 * | 2/2007 | Sung et al. | 257/316 |
| 2007/0122988 A1 * | 5/2007 | Luo et al. | 438/303 |
| 2007/0132038 A1 * | 6/2007 | Chong et al. | 257/401 |
| 2007/0202654 A1 * | 8/2007 | Ajmera et al. | 438/303 |
| 2007/0235802 A1 * | 10/2007 | Chong et al. | 257/346 |
| 2007/0246751 A1 * | 10/2007 | Cheng et al. | 257/288 |

FOREIGN PATENT DOCUMENTS

WO    2005096366 A1    10/2005

* cited by examiner

METHODS OF FORMING SEMICONDUCTOR DEVICES USING EMBEDDED L-SHAPE SPACERS

BACKGROUND OF THE INVENTION

The present disclosure relates to semiconductor devices and methods of forming such devices using an embedded L-shape spacer.

Both theoretical and empirical studies have demonstrated that carrier mobility in metal oxide semiconductor field effect transistors (MOSFET's) can be greatly increased when a stress of sufficient magnitude is applied to the conduction channel region of a transistor to create a strain therein.

Accordingly, it has been proposed to increase the performance of MOSFET's by applying a stress enhancement layer to the channel regions. Most prior art methods require the use of multiple spacers and multiple etching steps. Unfortunately, the use of multiple spacers can lead to significant processing costs and the use of multiple etching steps, particularly when etching causing significant recesses in the silicon layers and/or etching away of silicide, which can lead to decreased transistor performance.

Therefore, there is a need for methods that overcome and/or mitigate one or more of the above and or other deleterious effects of prior art methods.

BRIEF DESCRIPTION OF THE INVENTION

A method of forming a semiconductor device is provided. The method includes defining an L-shaped spacer on each side of a gate region of a substrate and embedding the L-shaped spacers in an oxide layer so that the oxide layer extends over a portion of the substrate a predetermined distance from a lateral edge of the L-shaped spacer.

A method of forming a semiconductor device is also provided that includes depositing a first oxide layer over a gate region and a semiconductor substrate, depositing a nitride layer on the first oxide layer, depositing a second oxide layer on the nitride layer, etching the first oxide layer, the second oxide layer, and the nitride layer to form an L-shaped spacer on each side of the gate region, and depositing a third oxide layer on the L-shaped spacers so that the third oxide layer covers a portion of the semiconductor substrate a predetermined distance from a lateral edge of the L-shaped spacer.

A semiconductor device is provided that includes a gate region, an L-shaped spacer, a source-drain region, and a silicide region. The gate region is on a semiconductor substrate. The L-shaped spacer is defined on at least one side of the gate region and includes a lateral edge. The source-drain region has an edge that is less than about ±200 Angstroms from the lateral edge. The silicide region has an edge that is substantially co-planar to the lateral edge.

The above-described and other features and advantages of the present invention will be appreciated and understood by those skilled in the art from the following detailed description, drawings, and claims.

DETAILED DESCRIPTION OF THE INVENTION

Figure 1:
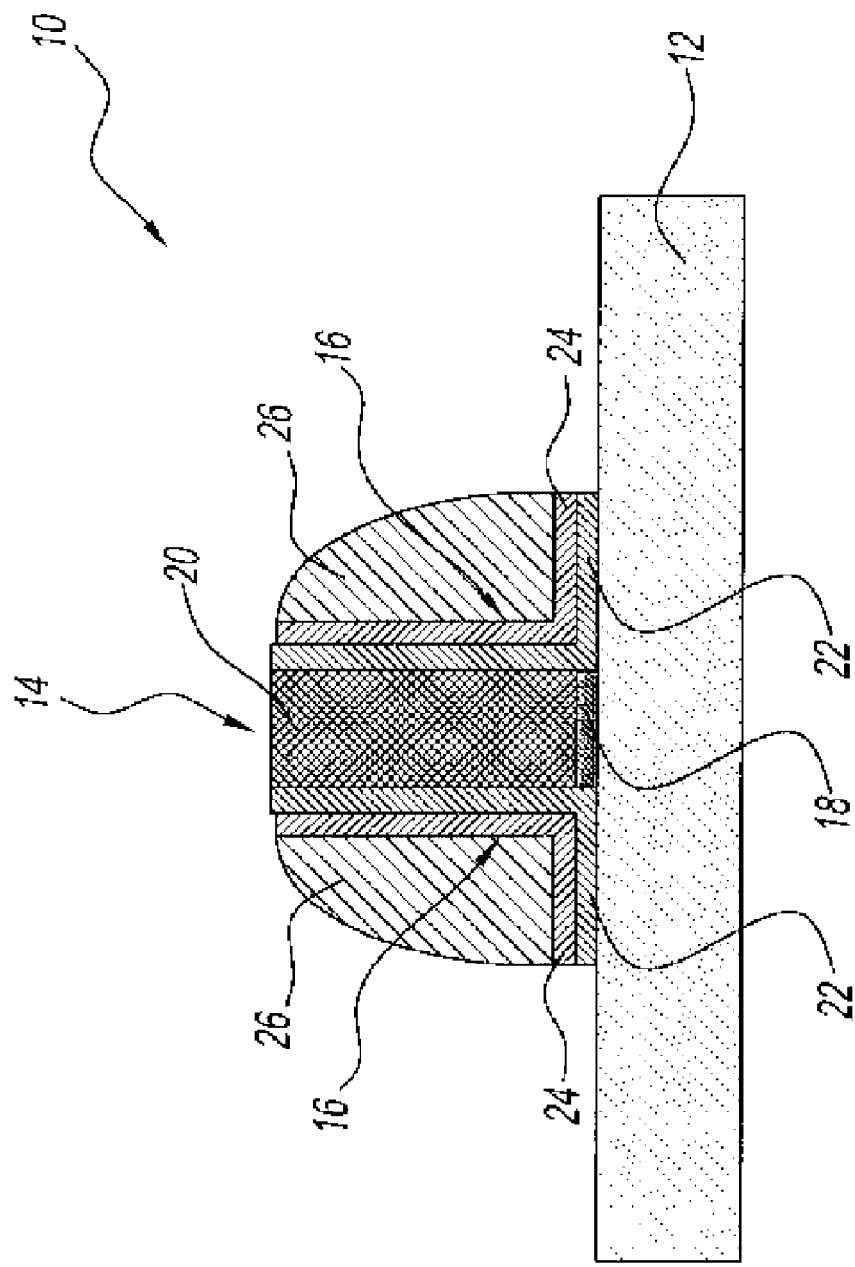
FIG. 1 is a schematic depiction showing a cross-sectional view of a semiconductor device according to the present disclosure, after formation of a pair of L-shaped spacers with additional oxide layer on opposing sides of a gate region.

Referring now to the drawings and in particular to FIGS. 1 through 8, an exemplary embodiment of a method according to the present disclosure of making a semiconductor device 10 is illustrated.

As shown in FIG. 1, semiconductor device 10 includes a substrate 12, a gate region 14, and a pair of L-shaped spacers 16 on opposite sides of the gate region, and a second oxide 26 on the L-shaped spacers. For purposes of clarity, semiconductor device 10 is illustrated by way of example having one gate region 14. Of course, it is contemplated by the present disclosure for semiconductor device 10 to include any number of gate regions and for some or all of such gate regions to have L-shaped spacers 16.

Gate region 14 includes a gate dielectric 18 and a gate material 20 overlying the gate dielectric. Gate dielectric 18 may be a conventional oxide, an oxynitride, other high-k materials, or any combinations thereof. Gate material 2—is, preferably, polysilicon, but may comprise of any conductive material. Substrate 12 is preferably silicon, but may be any semiconducting material or a layered substrate including at least one semiconducting material.

Each L-shaped spacer 16 includes a first oxide layer 22 and a nitride layer 24. In addition, the L-shaped spacer 16 can include a second oxide layer 26 disposed thereon during the process. First and second oxide layers 22, 26 can be made of many forms of silicon oxide, such as, but not limited to, low temperature oxide (LTO), Tetraethyl Orthosilicate (TEOS) oxide, High Density Plasma (HDP) oxide, atomic layer deposition (ALD) oxide, thermal oxide as well, and any combinations thereof. Nitride layer 24 can be made of materials, such as, but not limited to, of Rapid Thermal Chemical Vapor Deposition (RTCVD) nitride, Plasma Enhanced Chemical Vapor Deposition (PECVD) nitride, liquid phase chemical vapor deposition (LP CVD) nitride, High Density Plasma (HDP) nitride, atomic layer deposition (ALD) nitride, and any combinations thereof.

During the method of the present disclosure, first oxide layer 22 is deposited on gate region 14. Next, nitride layer 24 is deposited on first oxide layer 22 and second oxide layer 26 is deposited on the nitride layer. Finally, the oxide and nitride layers 22, 24, 26 are etched to provide L-shaped spacers 16 as shown in FIG. 1. For example, a reactive-ion-etch (RIE) can be used to form L-shaped spacers 16.

L-shaped spacer 16 has a vertical component and a horizontal component, where the horizontal component is formed on a portion of substrate 12 and the vertical component is formed on the walls of gate region 14.

Figure 2:
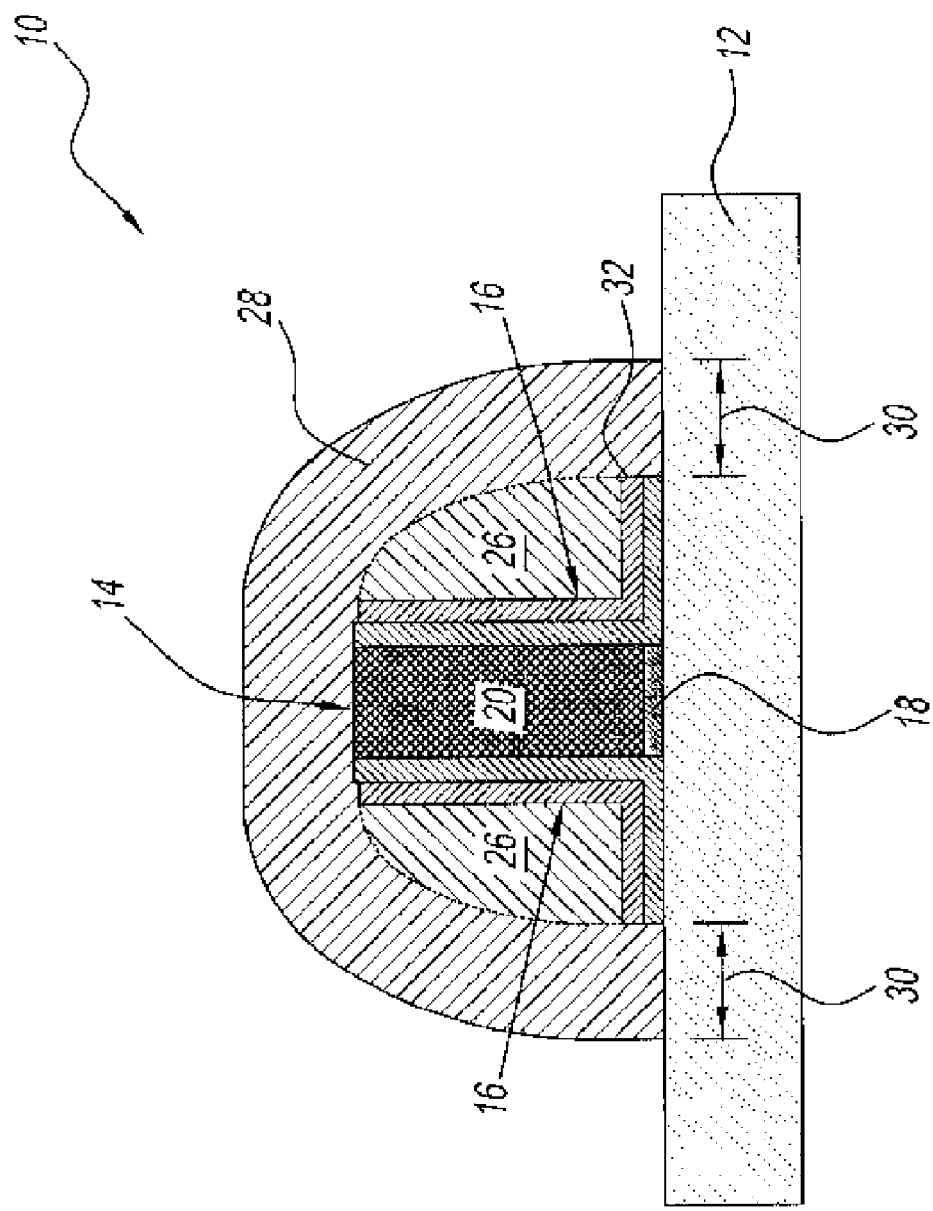
FIG. 2 illustrates the semiconductor device of FIG. 1, after embedding the L-shaped spacers in an oxide layer.

Advantageously, the method of the present disclosure embeds L-shaped spacer 16 in a third oxide layer 28 as shown in FIG. 2. For example, third oxide layer 28 is deposited such that a portion 30 of substrate 12 is covered by the third oxide layer. Thus, portion 30 extends a predetermined distance from a lateral edge 32 of L-shaped spacer 16. Preferably, portion 30 extends a predetermined distance of up to about 600 Angstroms from lateral edge 32, more preferably about between about 200 to about 400 Angstroms.

Figure 3:
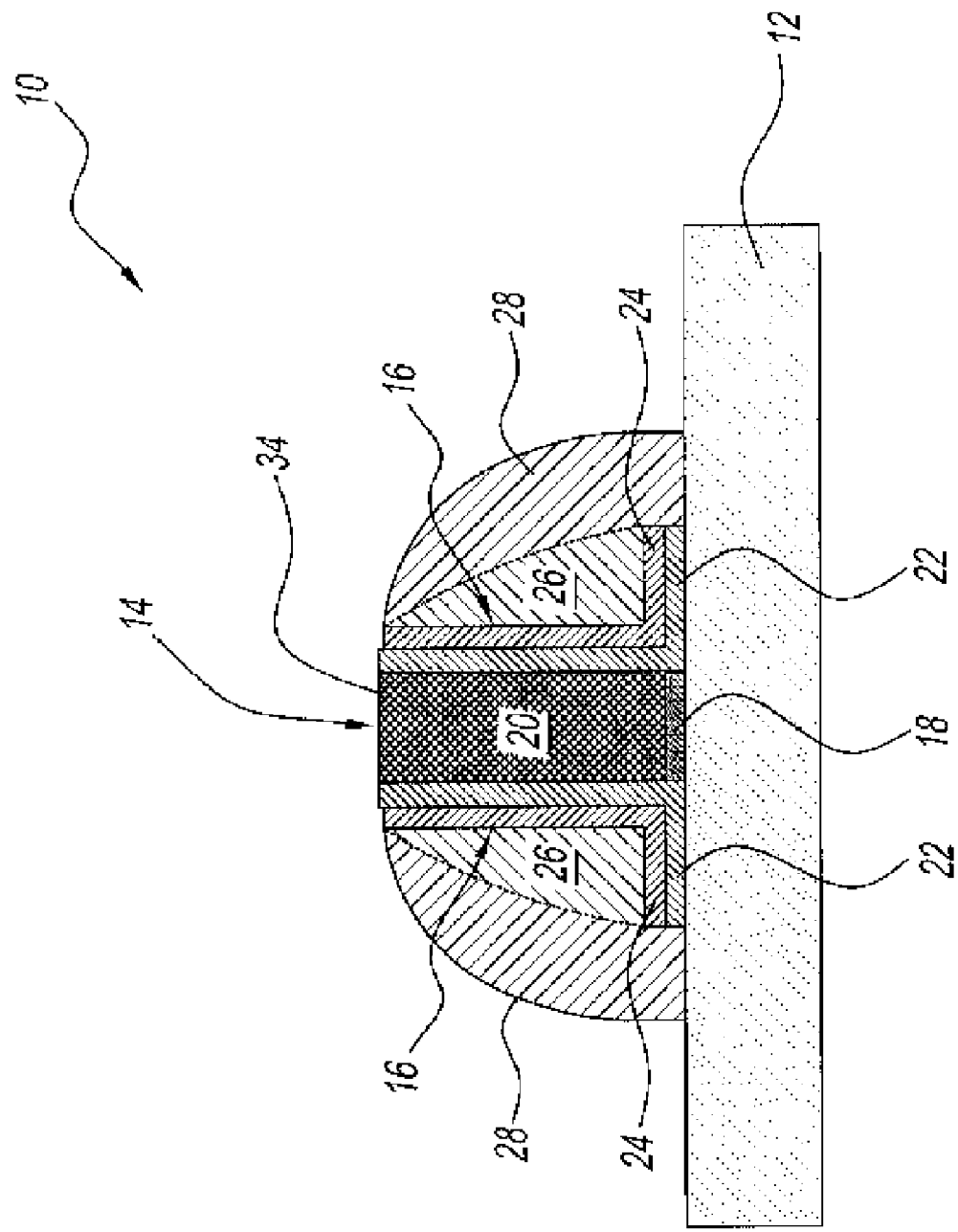
FIG. 3 illustrates the semiconductor device of FIG. 2, after an etching process to remove a portion of the oxide layer.

After deposition of third oxide layer 28, the third oxide layer is etched to reveal an upper portion 34 of polysilicon gate material 20 as shown in FIG. 3. For example, a reactive-ion-etch (RIE) can be used to remove portions of third oxide layer 28.

Figure 4:
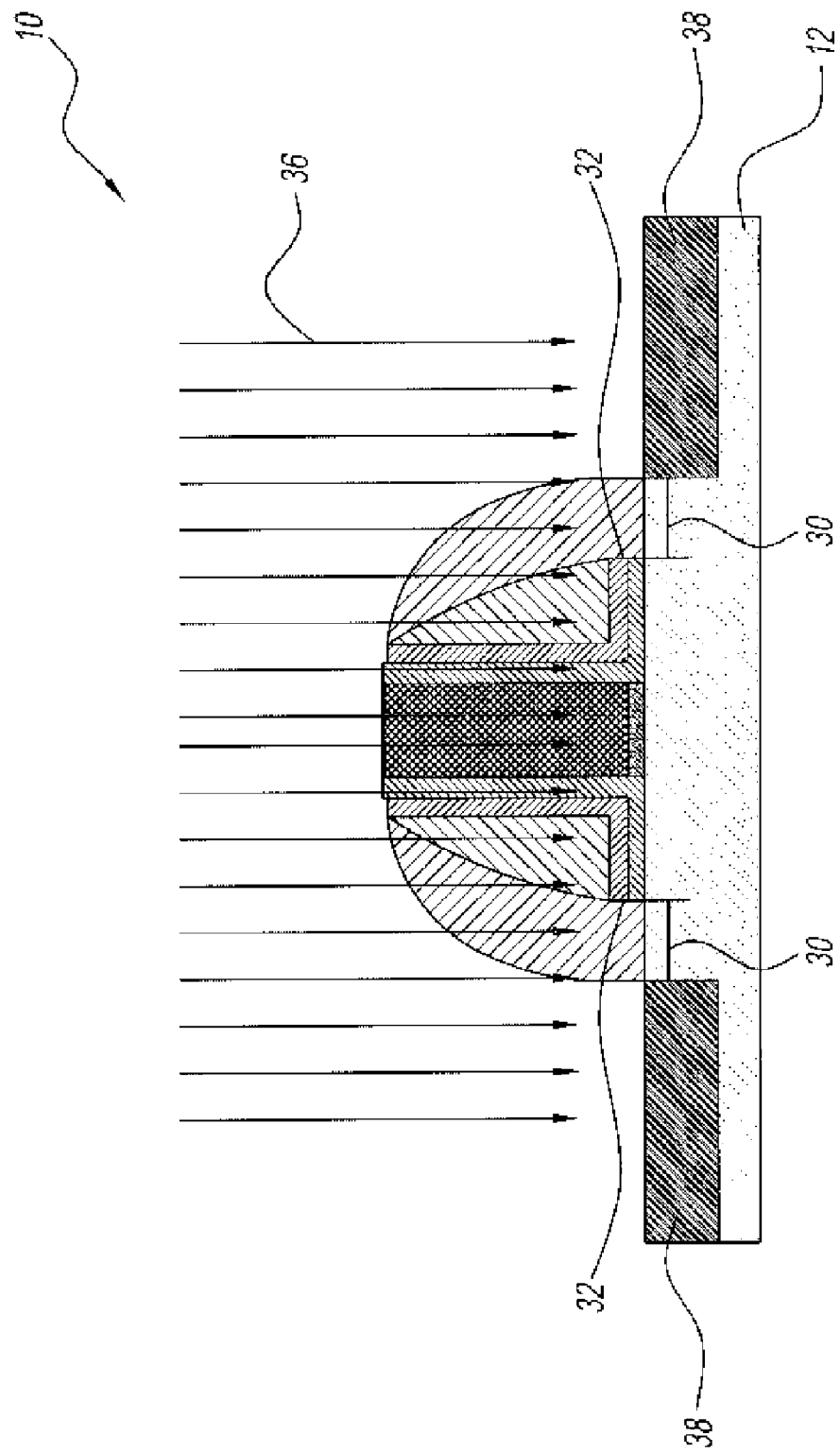
FIG. 4 illustrates the semiconductor device of FIG. 3, during ion implementation for defining ion implant regions.

As shown in FIG. 4, semiconductor device 10 is subjected to a known ion implantation process 36 to define ion implant regions 38 in substrate 12. Advantageously, third oxide layer 28 covers portion 30 of substrate 12 so that these portions are shielded from process 36. In this manner, ion implant regions 38 are defined the predetermined distance from lateral edges 32.

Figure 5:
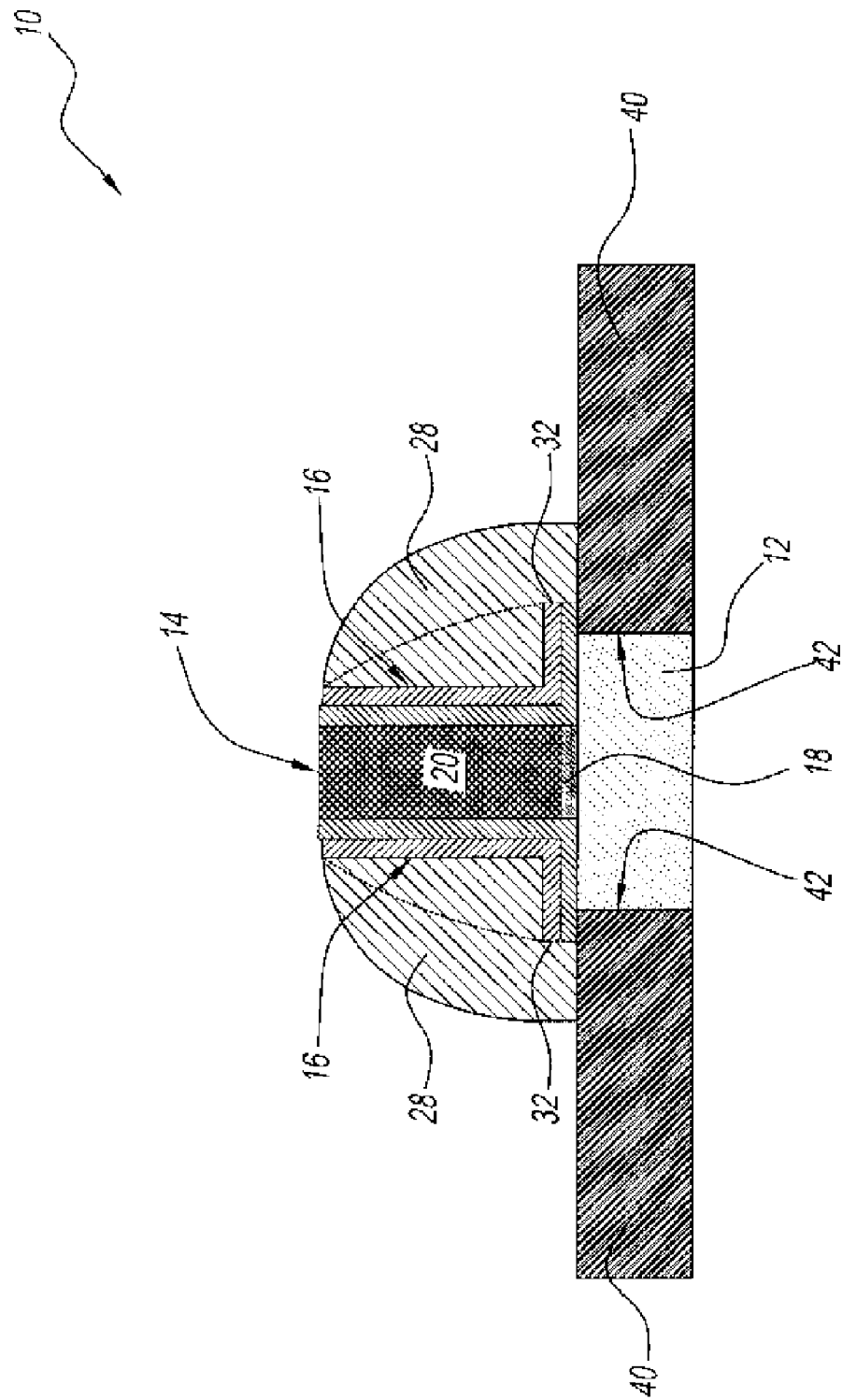
FIG. 5 illustrates the semiconductor device of FIG. 4, after annealing the implant regions to define source-drain regions.

After ion implantation process 36, semiconductor device 10 is subjected to a known annealing process to diffuse the implanted ions in ion implant regions 38 to define source-drain regions 40 in substrate 12. As shown in FIG. 5, source-drain regions 40 have an edge 42 that is less than about ±200 Angstroms from lateral edge 32. In some embodiments, edge 42 is co-planar with lateral edge 32.

Figure 6:
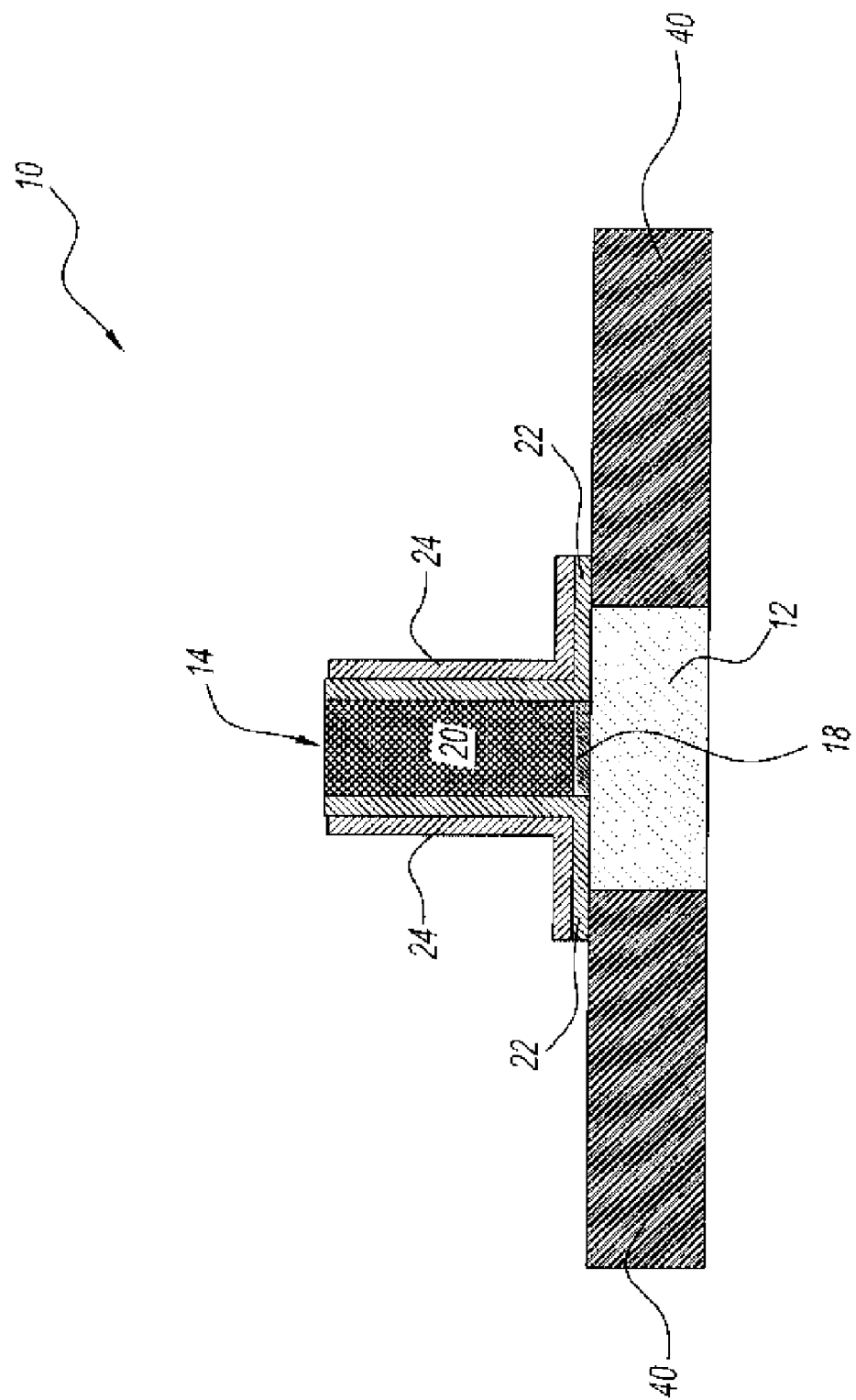
FIG. 6 illustrates the semiconductor device of FIG. 5, after removal of the remaining portions of the oxide layer.

After defining source-drain regions 40, second and third oxide layers 26, 28 are removed as shown in FIG. 6. For example, a reactive-ion-etch (RIE) can be used to remove second and third oxide layers 26, 28.

Figure 7:
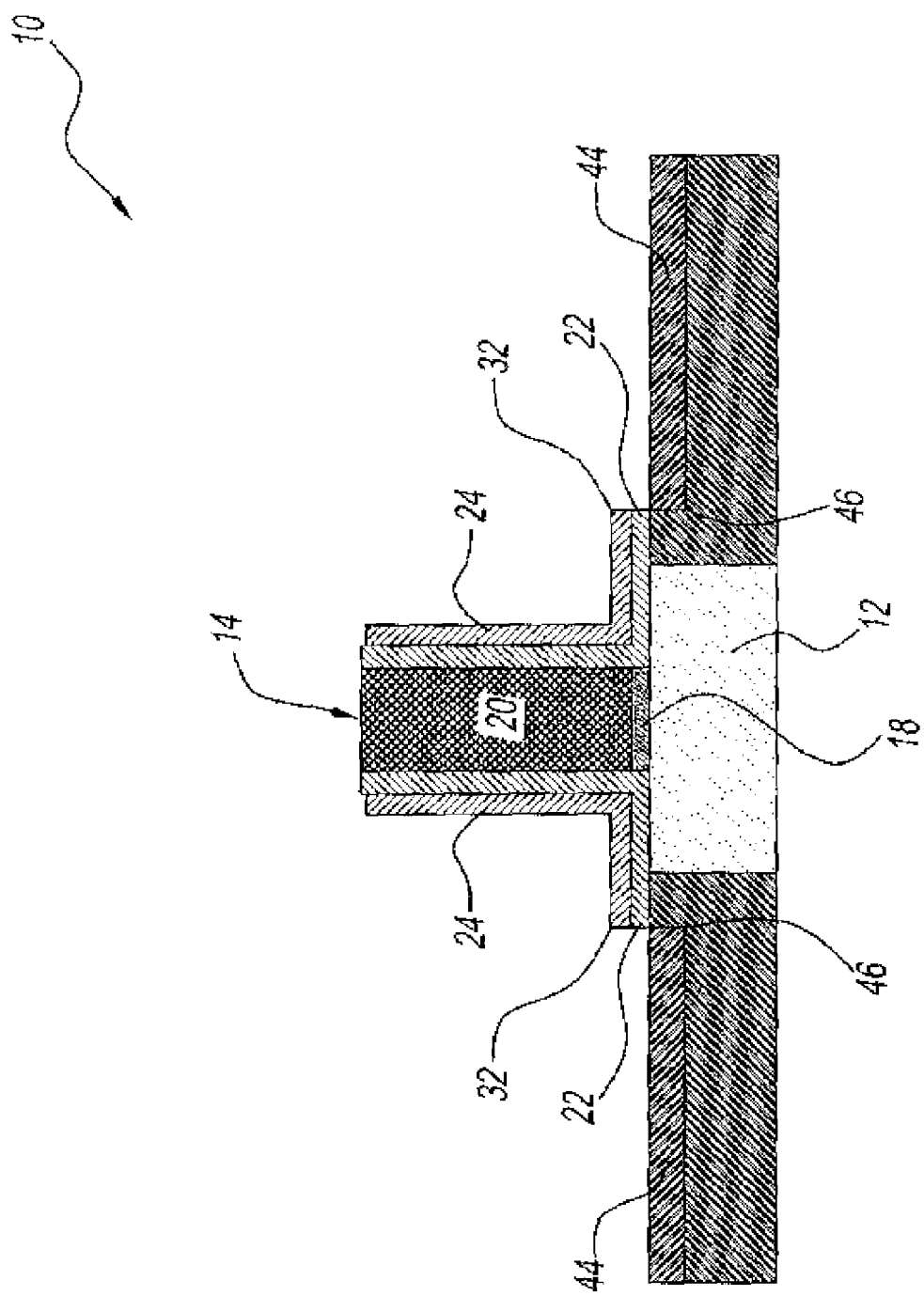
FIG. 7 illustrates the semiconductor device of FIG. 6, after forming silicide regions.

It can be seen that portion 30 of substrate 12 that was previously covered by third oxide layer 28 is now exposed by the removal of the third oxide layer. As such, semiconductor device 10 can be exposed to a known process to define silicide contacts 44 on exposed surfaces of substrate 12 as shown in FIG. 7. In this manner, silicide contacts 44 can be defined with an inner edge 46 that is substantially co-planar to lateral edge 32. Advantageously, silicide contacts 44 can be defined without need for subsequent etching steps, which are known to damage the silicide contacts. Thus, semiconductor device 10 includes suicide contacts 44 having inner edge 46 substantially co-planar to lateral edge 32, where the silicide contacts are free of etch induced damage.

Figure 8:
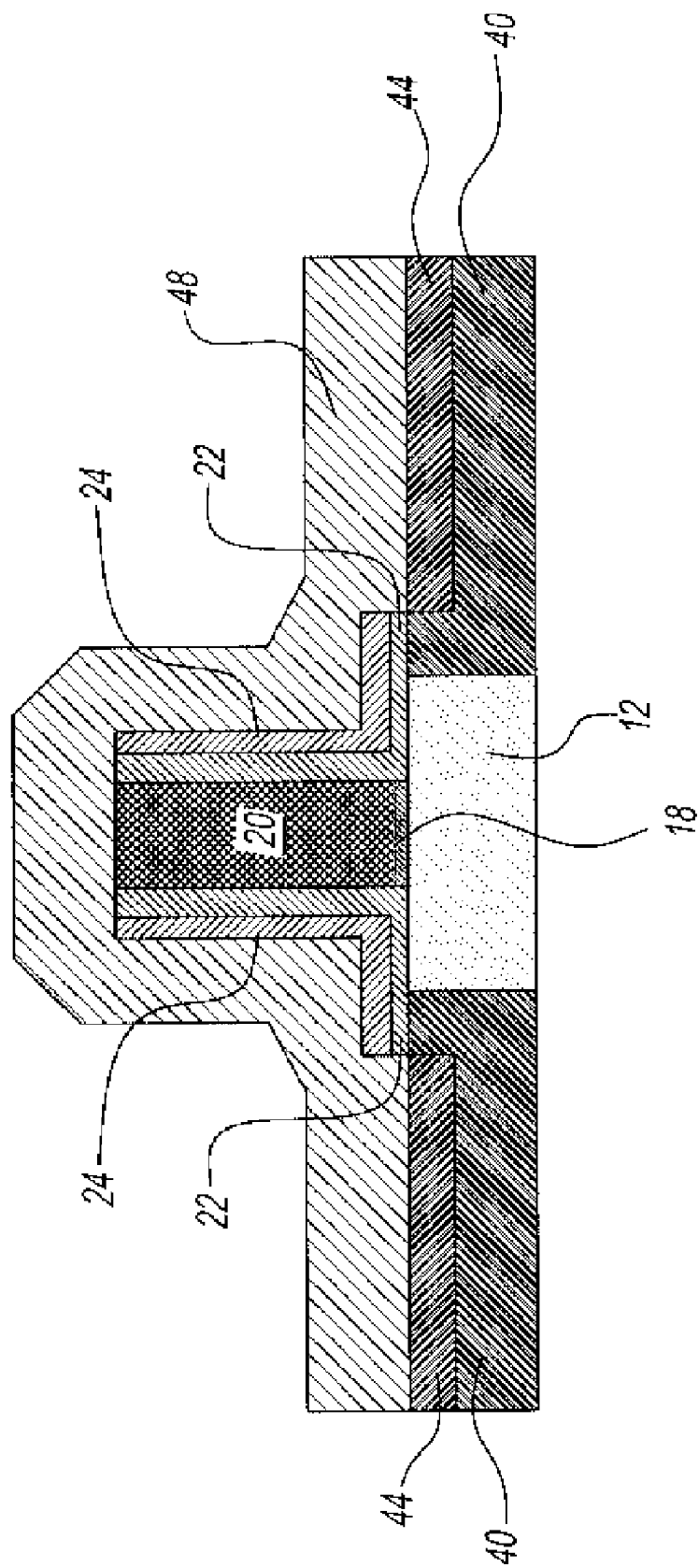
FIG. 8 illustrates the semiconductor device of FIG. 7, after deposition of a stress layer.

In order to induce and/or enhance stresses in the channel, semiconductor device can include a stress-enhancing layer 48 deposited thereon by known processes as shown in FIG. 8. Stress-enhancing layer preferably comprises CA nitride, such as but not limited to Rapid Thermal Chemical Vapor Deposition (RTCVD) nitride, Plasma Enhanced Chemical Vapor Deposition (PECVD) nitride, High Density Plasma (HDP) nitride, and any combinations thereof.

Those skilled in the art will understand that various changes may be made to the invention and equivalents may be substituted for elements thereof without departing from the scope of the present disclosure. In addition, many modifications may be made to adapt a particular situation or material to the disclosure without departing from the scope thereof. It is intended that the present disclosure not be limited to the particular embodiments disclosed, but that the disclosure will include all embodiments falling within the scope of the appended claims.

What is claimed is:

1. A method of forming a semiconductor device, comprising:
    depositing a first oxide layer over a gate region and a semiconductor substrate;
    depositing a nitride layer on said first oxide layer;
    depositing a second oxide layer on said nitride layer;
    etching said first oxide layer, said second oxide layer, and said nitride layer to form an L-shaped spacer on each side of said gate region;
    depositing a third oxide layer on said L-shaped spacers so that said third oxide layer covers a portion of said semiconductor substrate a predetermined distance from a lateral edge of said L-shaped spacer;
    etching said third oxide layer to reveal a top portion of said gate region and a top portion of said L-shaped spacer;
    implanting ions in said substrate to define an implant region in said substrate at said predetermined distance from said lateral edge;
    annealing said implant region to define a source-drain region, said source-drain region having an edge that is co-planar with said lateral edge;
    removing said second and third oxide layers; and
    forming a silicide region having an edge substantially co-planar to said lateral edge.

2. The method of claim 1, wherein said predetermined distance is up to about 600 Angstroms.

3. The method of claim 1, wherein said predetermined distance is between about 200 to about 400 Angstroms.

4. The method of claim 1, further comprising depositing a nitride stress layer over said silicide region, said L-shaped spacer, and said top portion of said gate region.

5. A method of forming a semiconductor device, comprising:
    depositing a first L-shaped oxide layer on each side of a gate region of a semiconductor substrate;
    depositing an L-shaped nitride layer on said first L-shaped oxide layer;
    depositing a second oxide layer on said L-shaped nitride layer;
    etching said first L-shaped oxide layer, said L-shaped nitride layer, and said second oxide layer to form an L-shaped spacer on each side of said gate region;
    depositing a third oxide layer on said L-shaped spacers so that said third oxide layer covers a portion of said semiconductor substrate a predetermined distance from a lateral edge of said L-shaped spacer;
    implanting ions in said substrate to define an implant region in said substrate at said predetermined distance from said lateral edge;
    annealing said implant region to define a source-drain region having an edge that is co-planar with said lateral edge;
    removing said second and third oxide layers; and
    forming a silicide region having an edge substantially co-planar to said lateral edge.

6. The method of claim 5, further comprising etching said third oxide layer to reveal a top portion of said gate region and a top portion of said L-shaped spacer before implanting said ions.

7. The method of claim 5, wherein said predetermined distance is up to about 600 Angstroms.

8. The method of claim 5, wherein said predetermined distance is between about 200 to about 400 Angstroms.

9. A method of forming a semiconductor device, comprising:
    forming an L-shaped spacer on each side of a gate region of a semiconductor substrate, said L-shaped spacer comprising a first oxide layer, a nitride layer, and a second oxide layer;
    depositing a third oxide layer on said L-shaped spacers so that said third oxide layer covers a portion of said semiconductor substrate a predetermined distance from a lateral edge of said L-shaped spacer; and implanting ions in said substrate to define an implant region in said substrate at said predetermined distance from said lateral edge;

annealing said implant region to define a source-drain region having an edge that is co-planar with said lateral edge;

removing said second and third oxide layers;

forming a silicide region having an edge substantially co-planar to said lateral edge; and depositing a nitride stress layer over said silicide region, said spacer, and said top portion of said gate region.

* * * * *